(12) United States Patent
Lasalandra et al.

(10) Patent No.: US 10,894,713 B2
(45) Date of Patent: Jan. 19, 2021

(54) TEMPERATURE-COMPENSATED MICRO-ELECTROMECHANICAL DEVICE, AND METHOD OF TEMPERATURE COMPENSATION IN A MICRO-ELECTROMECHANICAL DEVICE

(71) Applicant: STMicroelectronics S.r.l., Agrate Brianza (IT)

(72) Inventors: Ernesto Lasalandra, San Donato Milanese (IT); Angelo Merassi, Caponago (IT); Sarah Zerbini, Fontanellato (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 395 days.

(21) Appl. No.: 15/863,051

(22) Filed: Jan. 5, 2018

(65) Prior Publication Data

US 2018/0118561 A1    May 3, 2018

Related U.S. Application Data

(60) Continuation of application No. 14/271,009, filed on May 6, 2014, now Pat. No. 9,878,903, which is a
(Continued)

(30) Foreign Application Priority Data

Oct. 8, 2004    (EP) ..................... 04425753

(51) Int. Cl.
*B81C 1/00*    (2006.01)
*B81B 3/00*    (2006.01)
(Continued)

(52) U.S. Cl.
CPC .......... *B81C 1/0069* (2013.01); *B81B 3/0081* (2013.01); *B81C 1/00158* (2013.01);
(Continued)

(58) Field of Classification Search
None
See application file for complete search history.

(56) References Cited

U.S. PATENT DOCUMENTS 4,447,753 A * 5/1984 Ochiai ................... G04F 5/063
310/312
4,479,098 A   10/1984 Watson
(Continued)

FOREIGN PATENT DOCUMENTS

DE    42 26 430 A1    2/1994
DE    198 32 906 C1    2/2017
(Continued)

OTHER PUBLICATIONS

Esashi, M. et al., "Packaged Micromechanical Sensors," 1994 IEEE Symposium on Emerging Technologies & Factory Automation, Tokyo, Japan, Nov. 6-10, 1994, pp. 30-37.
(Continued)

*Primary Examiner* — Evren Seven
(74) *Attorney, Agent, or Firm* — Seed IP Law Group LLP (57) ABSTRACT

A micro-electromechanical device includes a semiconductor substrate, in which a first microstructure and a second microstructure of reference are integrated. The first microstructure and the second microstructure are arranged in the substrate so as to undergo equal strains as a result of thermal expansions of the substrate. Furthermore, the first microstructure is provided with movable parts and fixed parts with respect to the substrate, while the second microstructure has a shape that is substantially symmetrical to the first microstructure but is fixed with respect to the substrate. By subtracting the changes in electrical characteristics of the second microstructure from those of the first, variations in
(Continued)

electrical characteristics of the first microstructure caused by changes in thermal expansion or contraction can be compensated for.

18 Claims, 5 Drawing Sheets

Related U.S. Application Data division of application No. 12/683,888, filed on Jan. 7, 2010, now Pat. No. 8,733,170, which is a division of application No. 11/244,439, filed on Oct. 5, 2005, now Pat. No. 7,646,582.

(51) Int. Cl.

| | | |
|---|---|---|
| *G01C 19/56* | (2012.01) | |
| *G01C 19/5755* | (2012.01) | |
| *G01P 1/00* | (2006.01) | |
| *G01P 15/125* | (2006.01) | |
| *G01P 15/18* | (2013.01) | |
| *H03H 9/02* | (2006.01) | |
| *G01P 15/08* | (2006.01) | |

(52) U.S. Cl.
CPC .......... *B81C 1/00666* (2013.01); *G01C 19/56* (2013.01); *G01C 19/5755* (2013.01); *G01P 1/006* (2013.01); *G01P 15/125* (2013.01); *G01P 15/18* (2013.01); *H03H 9/02448* (2013.01); *B81B 2201/025* (2013.01); *G01P 2015/0814* (2013.01); *H03H 2009/02496* (2013.01); *Y10T 29/43* (2015.01)

(56) References Cited

U.S. PATENT DOCUMENTS

| | | | | |
|---|---|---|---|---|
| 4,592,242 | A | * | 6/1986 | Kempas ................ G01C 19/22 403/119 |
| 4,805,456 | A | * | 2/1989 | Howe ................... G01P 15/097 73/514.18 |
| 5,025,346 | A | * | 6/1991 | Tang ..................... B81B 3/0021 361/283.1 |
| 5,491,604 | A | * | 2/1996 | Nguyen ............. G01R 33/0286 331/116 M |
| 5,621,157 | A | | 4/1997 | Zhao et al. |
| 5,747,991 | A | | 5/1998 | Ito et al. |
| 5,780,885 | A | | 7/1998 | Diem et al. |
| 5,783,973 | A | | 7/1998 | Weinberg et al. |
| 5,909,078 | A | | 6/1999 | Wood et al. |
| 5,983,721 | A | | 11/1999 | Sulzberger et al. |
| 6,065,339 | A | | 5/2000 | Takeuchi et al. |
| 6,070,464 | A | | 6/2000 | Koury, Jr. et al. |
| 6,230,563 | B1 | * | 5/2001 | Clark ................. G01C 19/5719 73/504.04 |
| 6,269,696 | B1 | | 8/2001 | Weinberg et al. |
| 6,417,743 | B1 | | 7/2002 | Mihailovich et al. |
| 6,424,074 | B2 | * | 7/2002 | Nguyen ............... H03H 3/0078 310/309 |
| 6,504,356 | B2 | | 1/2003 | Yao et al. |
| 6,506,989 | B2 | | 1/2003 | Wang |
| 6,507,475 | B1 | | 1/2003 | Sun |
| 6,566,786 | B2 | * | 5/2003 | Nguyen ............... H03H 3/0078 310/309 |
| 6,577,040 | B2 | * | 6/2003 | Nguyen ............... H03H 3/0078 310/309 |
| 6,583,374 | B2 | | 6/2003 | Knieser et al. |
| 6,591,678 | B2 | | 7/2003 | Sakai |
| 6,598,475 | B2 | * | 7/2003 | Pinson ............... G01C 19/5719 73/504.12 |
| 6,823,733 | B2 | | 11/2004 | Ichinose |
| 6,837,108 | B2 | * | 1/2005 | Platt .................. G01C 19/5719 324/115 |
| 6,843,127 | B1 | * | 1/2005 | Chiou ................ G01C 19/5719 73/504.12 |
| 6,887,732 | B2 | | 5/2005 | Gopal et al. |
| 6,954,348 | B1 | | 10/2005 | Rodgers |
| 6,980,412 | B2 | | 12/2005 | Cheng et al. |
| 7,287,428 | B2 | * | 10/2007 | Green ................ G01C 19/5719 73/504.12 |
| 7,322,242 | B2 | | 1/2008 | Merassi et al. |
| 7,331,209 | B2 | | 2/2008 | Saari et al. |
| 7,520,171 | B2 | | 4/2009 | Merassi et al. |
| 7,603,902 | B2 | | 10/2009 | Katashi |
| 8,156,783 | B2 | | 4/2012 | Beer |
| 2005/0132805 | A1 | | 6/2005 | Park et al. |
| 2008/0138922 | A1 | * | 6/2008 | Wan .................... B81C 1/00095 438/52 |

FOREIGN PATENT DOCUMENTS

| | | |
|---|---|---|
| EP | 1 217 735 A1 | 6/2002 |
| WO | 98/52051 A1 | 11/1998 |
| WO | 03/106927 A2 | 12/2003 |

OTHER PUBLICATIONS

Moe, S.T., et al., "Capacitive Differential Pressure Sensor for Harsh Environments," Sensors and Actuators, 83(2000):30-33, May 2000.
Seidel, H., et al., "A Piezoresistive Silicon Accelerometer with Monolithically Integrated CMOS-Circuitry," Transducers '95-Eurosensors IX, The 8th International Conference on Solid-State Sensors and Actuators, and Eurosensors IX, Stockholm, Sweden, Jun. 25-29, 1995, pp. 597-600.

\* cited by examiner

TEMPERATURE-COMPENSATED MICRO-ELECTROMECHANICAL DEVICE, AND METHOD OF TEMPERATURE COMPENSATION IN A MICRO-ELECTROMECHANICAL DEVICE

BACKGROUND OF THE INVENTION

Field of the Invention

The present invention relates to a temperature-compensated micro-electromechanical device and to a method of temperature compensation in a micro-electromechanical device.

Description of the Related Art

As is known, the use of micro-electromechanical systems (MEMS) is increasingly widespread in several sectors of technology and has yielded encouraging results especially in the construction of inertial sensors, micro-integrated gyroscopes, and electromechanical oscillators for a wide range of applications.

MEMS systems of this type usually comprise at least one mass, which is connected to a fixed body (stator) by means of springs and is movable with respect to the stator according to pre-determined degrees of freedom. The movable mass and the stator are capacitively coupled by a plurality of respective comb-fingered electrodes facing one another so as to form capacitors. The movement of the movable mass with respect to the stator, for example on account of an external stress, modifies the capacitance of the capacitors; from which it is possible to deduce the relative displacement of the movable mass with respect to the fixed body, and hence the degree of force applied to cause the movement. On the other hand, it is also possible to apply an electrostatic force to the movable mass to set it in motion, by supplying appropriate biasing voltages.

In optimal working conditions, MEMS systems present excellent performance; in particular, MEMS inertial sensors are extremely sensitive and precise. However, a limit of currently available MEMS systems lies in the strong dependence of their response upon the temperature. In fact, also on account of their extremely small dimensions, very modest variations in temperature can produce significant strains in micro-electromechanical structures. Such strains are equivalent to relative displacements of the electrodes of the movable mass with respect to those of the stator and cause a detectable variation of the capacitive coupling between stator and movable mass. In practice, then, an offset, due to the variations in temperature, is added to the output signal of the MEMS system.

To overcome this drawback, MEMS systems are frequently incorporated in special packages, made so as to reduce the effects of thermal expansion. Alternatively, it has been proposed to use compensation circuits that electrically erase the effects of possible thermal drifts. According to one solution, for example, a nonlinear element with a temperature dependent electrical characteristic is integrated in the reading interface of the MEMS system (a diode, for example). Another technique envisages, instead, the use of a temperature sensor.

The solutions illustrated above are, however, not really satisfactory both because in any case the achievable precision is not optimal and because high costs are involved. The special packages, in fact, cannot be of a standard type and hence have very high design and fabrication costs. The compensation circuits require burdensome procedures for measuring the thermal drifts and calibrating the compensation curves and, moreover, a sufficient stability over time cannot be guaranteed.

BRIEF SUMMARY OF THE INVENTION

Embodiments of the present invention provide a temperature-compensated micro-electromechanical device and a method of temperature compensation in a micro-electromechanical device.

According to one embodiment of the invention, a micro-electromechanical device is provided, comprising a semiconductor substrate, a first microstructure integrated in the substrate, and a second microstructure integrated in the substrate as a reference, and arranged so that the first microstructure and the second microstructure undergo equal strains as a result of thermal expansions of the substrate. The first microstructure comprises movable parts and fixed parts with respect to the substrate, while the second microstructure has a shape substantially symmetrical to the first microstructure, but is fixed in position with respect to the substrate.

The first and second microstructures are specularly symmetrical with respect to a symmetry axis of the substrate. That is to say that the second microstructure is a mirror image of the first microstructure, and they are symmetrically positioned with respect to a center of mass of the semiconductor substrate. According to an embodiment of the invention, the first microstructure includes a capacitive coupling between movable electrodes and fixed electrodes, while the second microstructure includes a capacitive coupling between electrodes in positions corresponding to the movable and fixed electrodes of the first microstructure. Because of their substantially identical configuration, the capacitive couplings of the first and second microstructures are substantially identical in their response to changes in temperature, though only the first microstructure is movable with respect to the substrate.

According to an embodiment of the invention, a method is provided in which changes in the capacitive coupling of the first microstructure are employed to detect acceleration of the semiconductor substrate, while changes in the capacitive coupling of the second microstructure are employed to compensate for changes in the capacitive coupling of the first microstructure caused by thermal effects.

BRIEF DESCRIPTION OF THE SEVERAL VIEWS OF THE DRAWING(S)

For a better understanding of the invention, some embodiments thereof are now described, purely by way of non-limiting example and with reference to the attached drawings.

DETAILED DESCRIPTION OF THE INVENTION

Figure 1:
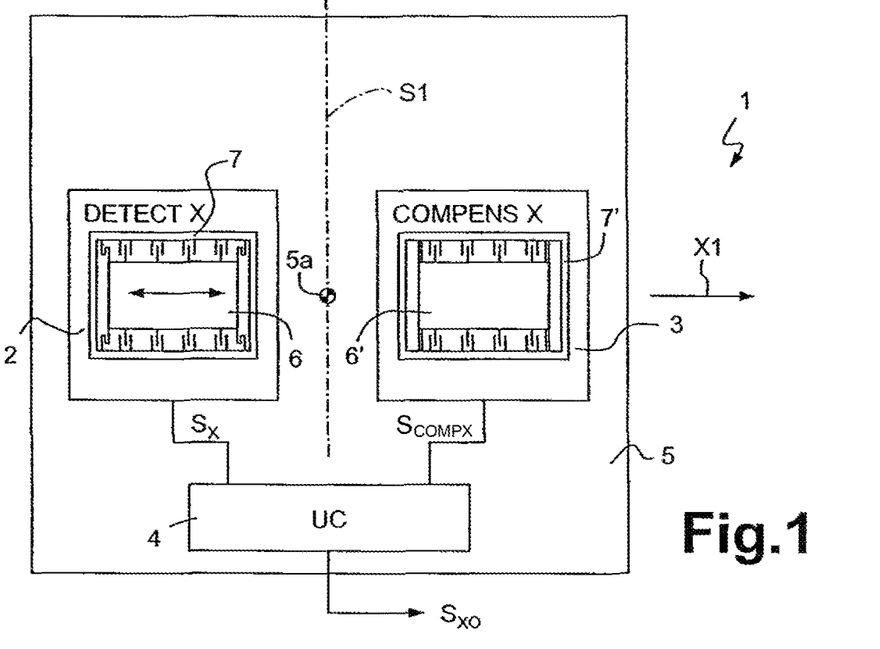
FIG. 1 is a simplified block diagram of a micro-electromechanical device according to a first embodiment of the present invention.
Figure 2:
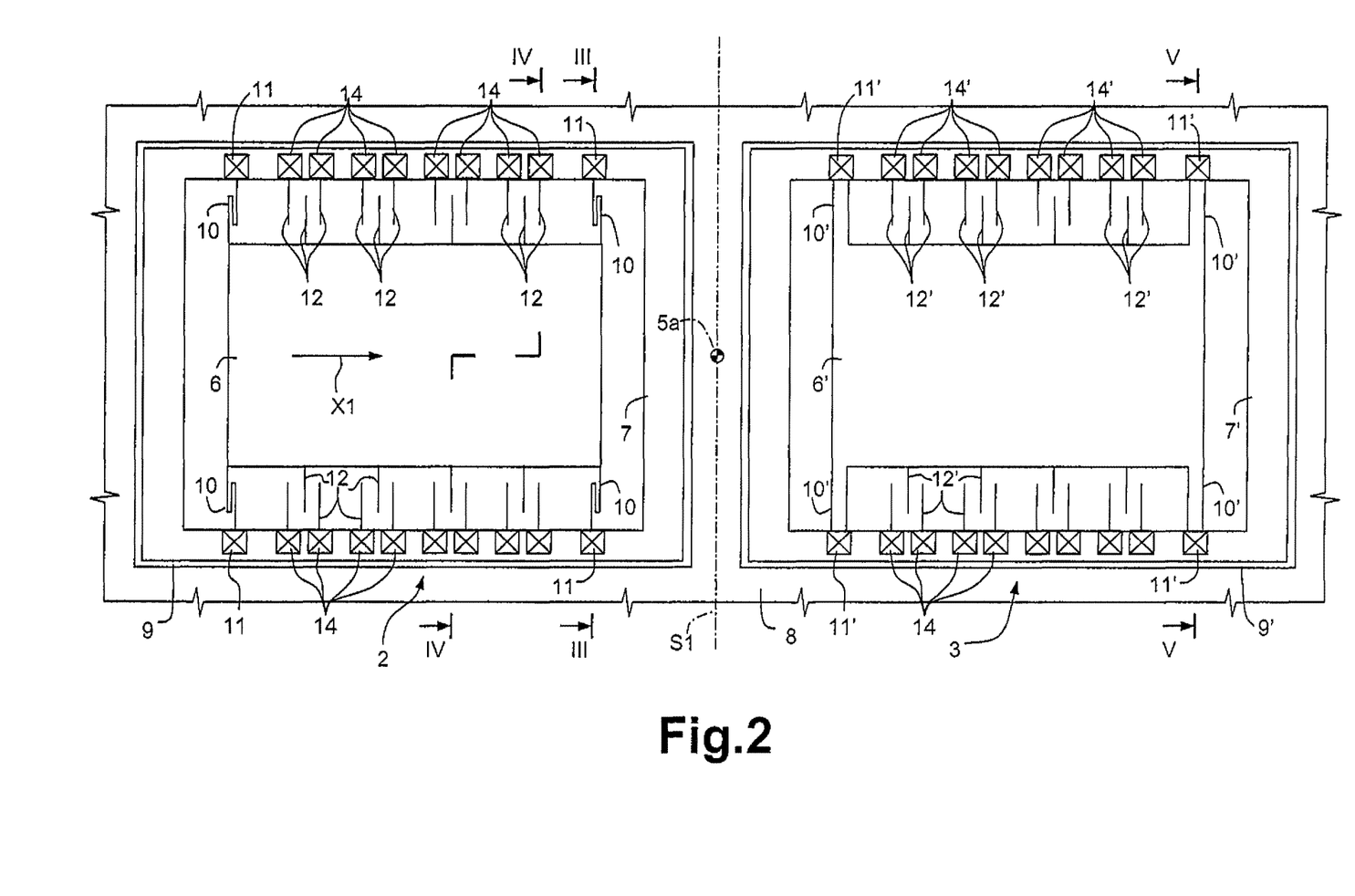
FIG. 2 is a schematic top plan view of a part of a semiconductor chip included in the device of FIG. 1.
Figure 3:
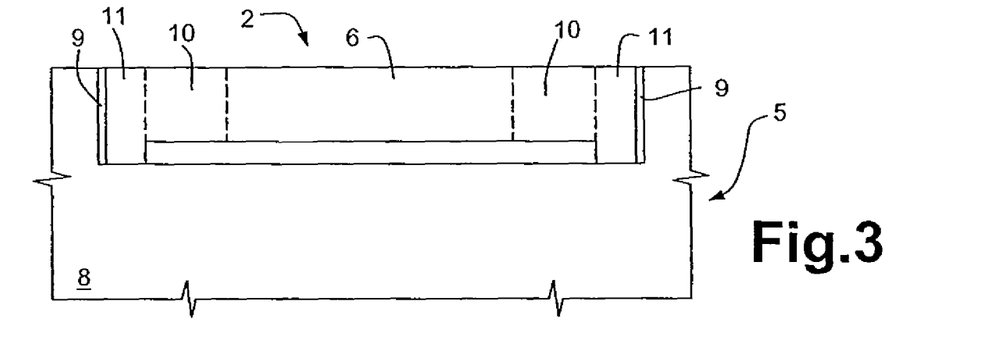
FIGS. 3-5 are cross sections through the chip of FIG. 2, taken, respectively, along the lines III-III, IV-IV and V-V of FIG. 2.

FIG. 1 illustrates a linear MEMS accelerometer 1 having a detection axis X1. The MEMS accelerometer 1 comprises a detection microstructure 2 and a reference microstructure 3 that are substantially identical to one another and are both integrated in a same chip 5 of semiconductor material, together with a control unit 4. More precisely, the chip 5 has a rectangular or square shape and has a geometrical center 5a, which is also a center of symmetry. The detection microstructure 2 and the reference microstructure 3 are specular with respect to a symmetry axis S1 which is perpendicular to the detection axis X1 and passes through the center 5a of the chip 5. The detection microstructure 2 and the reference microstructure 3 are moreover connected to the control unit 5 for supplying a measurement signal $S_X$, correlated to the accelerations imparted to the chip 5 according to the detection axis X1, and, respectively, a compensation signal $S_{COMP}$ indicating the expansion to which the chip 5 is subjected as a result of the temperature.

With reference to FIGS. 2-5, the detection microstructure 2 comprises a suspended mass 6 and a stator structure 7, which is fixed to a substrate 8 of the chip 5 and separated from the suspended mass 6 in a conventional way by means of insulating regions (not illustrated). A trench 9, in this case filled with dielectric material, separates the stator structure 7 laterally from the substrate 8. The suspended mass 6 is mechanically connected to the stator structure 7 by a plurality of elastic connection elements 10 (four, in the example described), so shaped as to enable the suspended mass 6 to oscillate with respect to the stator structure 7 in the direction of the detection axis X1. The elastic connection elements 10 (FIG. 3) extend from the suspended mass 6 and are fixed to respective suspension anchorages 11 of the stator structure 7.

Figure 4:
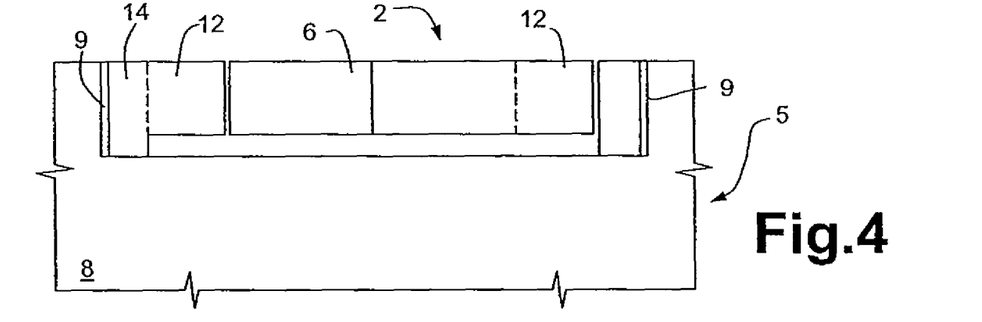
Figure 5:
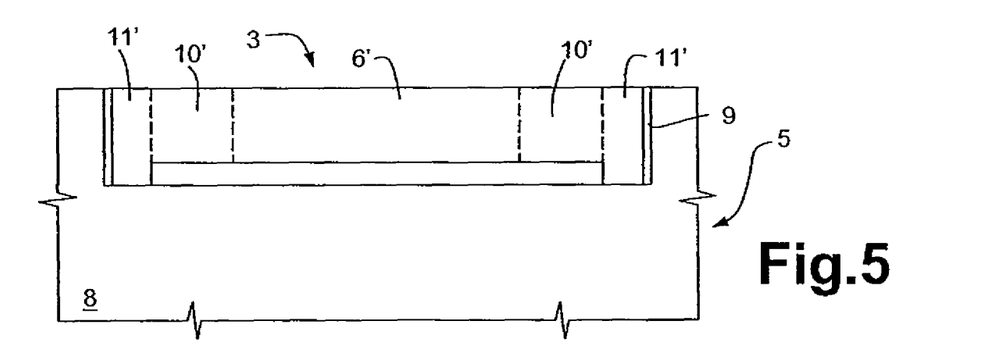

The suspended mass 6 and the stator structure 7 are provided with respective plane detection electrodes 12, arranged perpendicular to the detection axis X1 and comb-fingered (see also FIG. 4). In greater detail, the detection electrodes 12 of the suspended mass 6 project from the suspended mass 6 itself towards the stator structure 7; instead, the detection electrodes 12 of the stator structure 7 are fixed to respective stator anchorages 14 and project towards the suspended mass 6, at a distance from the substrate 8 of the chip 5. Furthermore, each detection electrode 12 of the suspended mass 6 faces and is capacitively coupled to a respective pair of detection electrodes 12 of the stator structure 7. In turn, the detection electrodes 12 of the stator structure 7 are electrically connected to one another in sets, according to conventional schemes of MEMS accelerometers (not illustrated in detail herein). The detection microstructure 2 is also equipped with the normal electrical connections of one-axis linear accelerometers (not illustrated herein) for connection of the detection electrodes 12 to the control unit 4.

The reference microstructure 3 is substantially identical and is arranged symmetrically to the detection microstructure 2 with respect to the symmetry axis S1, which is perpendicular to the detection axis X1 and passes through the center 5a of the chip 5. In particular, the reference microstructure 3 comprises a suspended mass 6' and a stator structure 7', which have the same shapes and dimensions as the suspended mass 6 and, respectively, the stator structure 7 of the detection microstructure 2 and are separated from one another in a conventional way by means of insulating regions (not illustrated). The stator structure 7' is delimited laterally by the substrate 8 of the chip 5 by means of a trench 9' filled with dielectric material. In the case of the reference microstructure 3, however, the suspended mass 6' is rigidly connected to the stator structure 7' by means of rigid connection elements 10', which are substantially non-deformable. The suspended mass 6' is hence fixed with respect to the stator structure 7'. The rigid connection elements 10' project from the suspended mass 6', at a distance from the substrate 8 of the chip 5, and are fixed to respective suspension anchorages 11', which have the same shape and the same relative distances as the first suspension anchorages 11 of the detection microstructure 2 (see also FIG. 5). The suspended mass 6' and the stator structure 7' are provided with respective plane detection electrodes 12', arranged perpendicular to the detection axis X1 and comb-fingered. The detection electrodes 12' of the reference microstructure 3 have the same shape and the same relative positions as the detection electrodes 12 of the detection microstructure 2. In particular, the detection electrodes 12' of the suspended mass 6' project therefrom towards the stator structure 7'; the detection electrodes 12' of the stator structure 7' are instead fixed to respective stator anchorages 14" and project towards the suspended mass 6". Furthermore, each detection electrode 12" of the suspended mass 6" faces and is capacitively coupled to a respective pair of detection electrodes 12" of the stator structure 7". The detection electrodes 12" of the stator structure 7" are connected to one another in sets according to conventional schemes of MEMS accelerometers and are not illustrated herein in detail. The stator anchorages 14" of the reference microstructure 3 have the same shape and the same relative distances as the stator anchorages 14 of the detection microstructure 2. Also the reference microstructure 3 is provided with the normal electrical connections (not illustrated) of the one-axis linear MEMS accelerometers for connection of the detection electrodes 12" with the control unit 4.

In use, the detection microstructure 2 and the reference microstructure 3 are read by the control unit 4 using conventional reading modalities of linear MEMS accelerometers. As described above, moreover, the detection microstructure 2 and the reference microstructure 3 are substantially identical and, since they are also integrated in the same chip 5, they are deformed exactly in the same way as a result of thermal expansion. In particular, the relative distances of the suspension anchorages 11" and of the stator anchorages 14" of the reference microstructure 3, even though they are not fixed, remain in any case equal to the relative distances of the corresponding suspension anchorages 11 and stator anchorages 14 of the detection microstructure 2. For this reason, the configuration of the detection electrodes 12" of the suspended mass 6" and of the stator structure 7" of the reference microstructure 3 is always equal to the rest configuration (i.e., in the absence of accelerations along the detection axis X1) of the detection electrodes 12 of the suspended mass 6 and of the stator structure 7 of the detection microstructure 2. Consequently, temperature variations of the chip 5 cause identical variations in the measurement signal $S_X$ and in the compensation signal $S_{COMP}$. However, in the measurement signal $S_X$ the effect of temperature variations is superimposed on the effect of the accelerations according to the detection axis X1, whereas the variations of the compensation signal $S_{COMP}$ depend exclusively upon thermal expansion, because the suspended mass 6' of the reference microstructure 3 is fixed. The compensation signal $S_{COMP}$ can thus be used for effective compensation of the effects of thermal expansion on the measurement signal $S_X$.

For this purpose, the control unit 4 subtracts the compensation signal $S_{COMP}$ from the measurement signal $S_X$ for generating the output acceleration signal $S_{XO}$.

The location of the detection microstructure 2 and of the reference microstructure 3 in specularly symmetrical positions with respect to the symmetry axis S1 of the chip 5 enables maximum precision of compensation to be achieved, also considering that, on account of the thermal expansion, the chips tend to undergo deformation and to assume a cup-like shape. Owing to the described arrangement, the compensation is extremely precise because, practically in any operating condition, the thermal expansion acts homogeneously on the detection microstructure 2 and on the reference microstructure 3.

Figure 6:
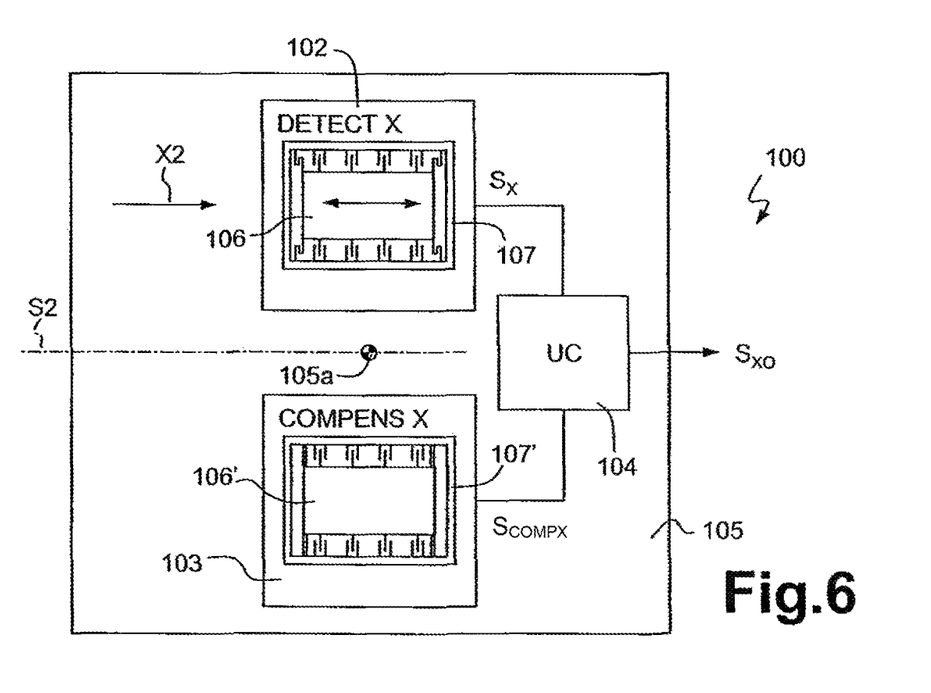
FIG. 6 is a simplified block diagram of a micro-electromechanical device according to a second embodiment of the present invention.

According to an alternative embodiment of the invention, illustrated in FIG. 6, a linear MEMS accelerometer 100 having a detection axis X2 comprises a detection microstructure 102, a reference microstructure 103, and a control unit 104, integrated in a semiconductor chip 105 of a square or rectangular shape and having a center 105a of symmetry. The detection microstructure 102 and the reference microstructure 103 are of the type illustrated in FIG. 2. In particular, the detection microstructure 102 comprises a suspended mass 106, movable along the detection axis X2 with respect to a fixed stator structure 107; and the detection microstructure 103 comprises a suspended mass 106' and a stator structure 107', both fixed and having the same shape and the same dimensions as the suspended mass 106 and, respectively, as the stator structure 107 of the detection microstructure 102. Furthermore, the detection microstructure 102 and the reference microstructure 103 are specularly symmetrical with respect to a symmetry axis S2, parallel to the detection axis X2 and passing through the center 105a of the chip 105, and are aligned in a direction perpendicular to the detection axis X2 itself.

Figure 7:
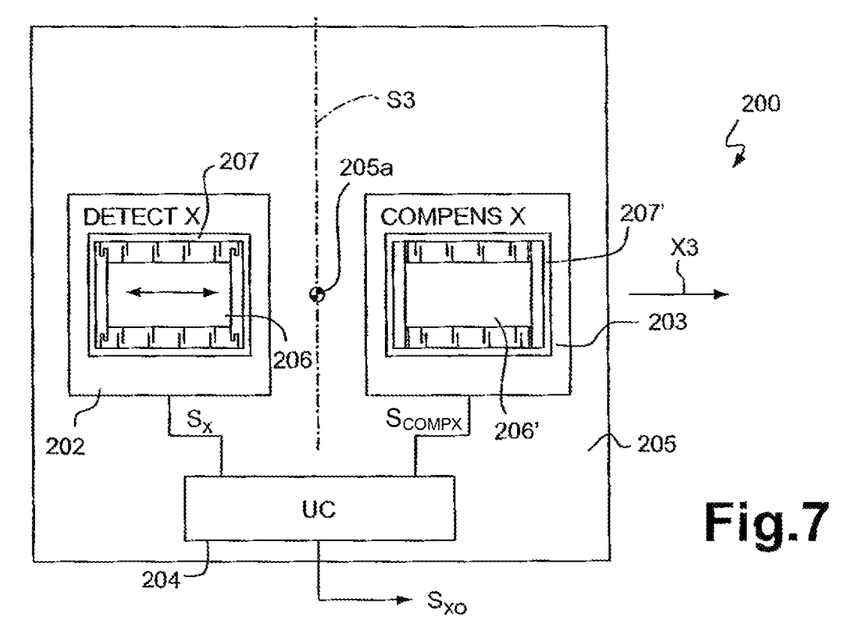
FIG. 7 is a simplified block diagram of a micro-electromechanical device according to a third embodiment of the present invention.
Figure 8:
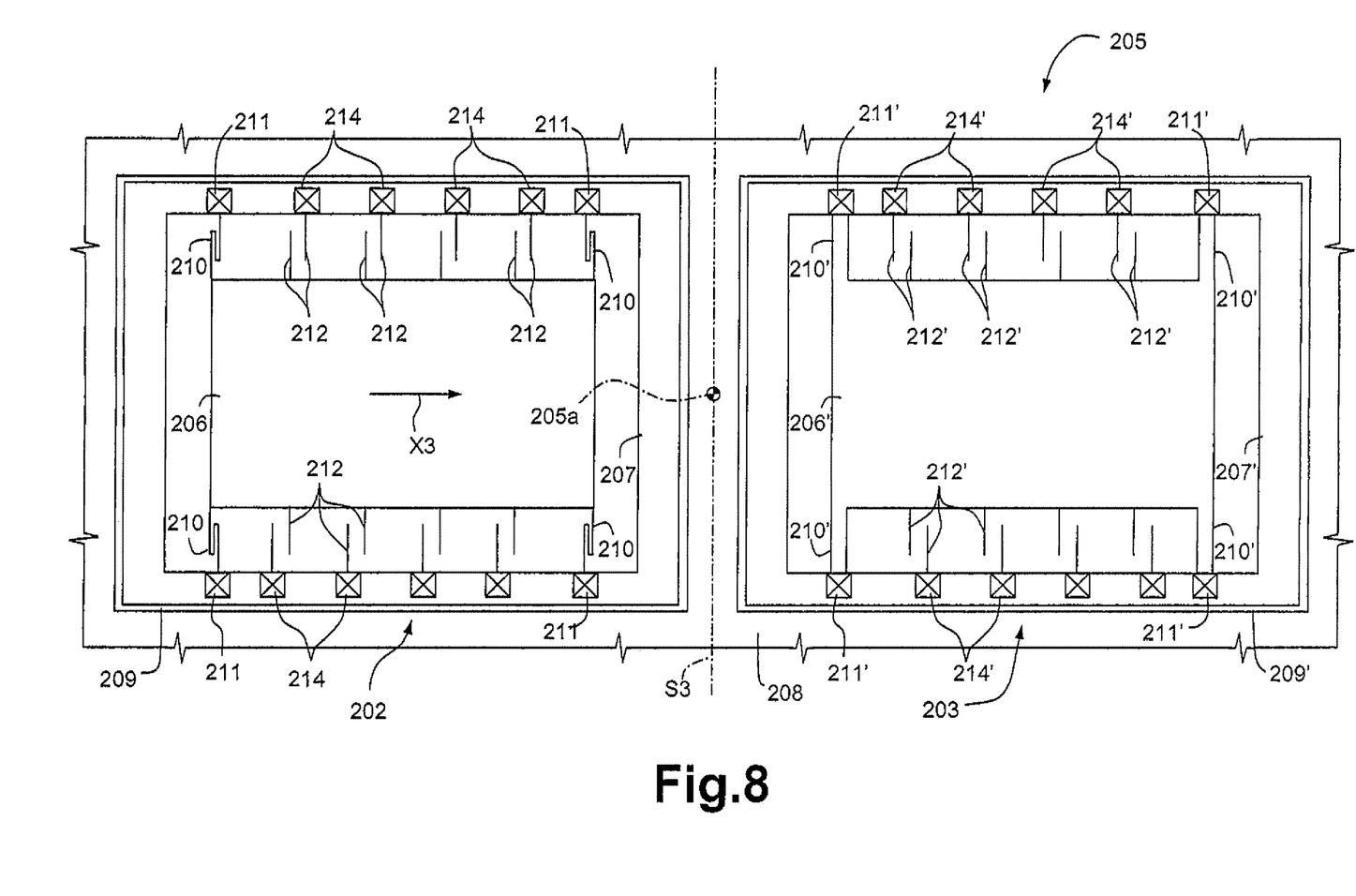
FIG. 8 is a schematic top plan view of a part of a semiconductor chip included in the device of FIG. 7.

A third embodiment of the invention is illustrated in FIGS. 7 and 8. In this case, a linear MEMS accelerometer 200 having a detection axis X3 comprises a detection microstructure 202, a reference microstructure 203 and a control unit 204, which are integrated in a semiconductor chip 205 of a square or rectangular shape and having a center 205a of symmetry. The detection microstructure 202 and the reference microstructure 203 are identical to one another and are symmetrical with respect to a symmetry axis S3 perpendicular to the detection axis X3 and passing through the center 205a of the chip 205. In greater detail, the detection microstructure 202 comprises a suspended mass 206, a stator structure 207, and elastic connection elements 210, which connect the suspended mass 206 to respective suspension anchorages 211 of the stator structure 207 in a way similar to what is described in relation to the detection microstructure 2 of FIG. 2. In particular, the suspended mass 206 of the detection microstructure 202 is constrained to the stator structure 207 so as to be oscillatable according to the detection axis X3. The suspended mass 206 and the stator structure 207 of the detection microstructure 202 are separated from one another in a conventional way by insulating regions (not illustrated) and are provided with respective comb-fingered detection electrodes 212, facing one another in pairs to establish a capacitive coupling. More precisely, each electrode 212 of the stator structure 207 is fixed to a respective anchoring stator 214 and is coupled to a respective detection electrode 212 of the suspended mass 206. Furthermore, with reference to the arrangement of FIG. 6, the detection electrodes 212 arranged on the top side of the suspended mass 206 have their right-hand face coupled to the left-hand face of the respective detection electrode 212 of the stator structure 207; instead, the detection electrodes 212 set on the bottom side of the suspended mass 206 have their left-hand face coupled to the right-hand face of the respective detection electrode 212 of the stator structure 207. The detection electrodes 212 of the stator microstructures 207 are connected to one another in sets in a conventional way and not illustrated in detail.

The reference microstructure 203 comprises a suspended mass 206" and a stator structure 207", having the same shape and the same dimensions as the suspended mass 206 and as the stator structure 207 of the detection microstructure 202 and separated from one another in a conventional way by insulating regions (not illustrated). The suspended mass 206" is rigidly connected to the stator structure 207" by means of rigid connection elements 210", which are substantially non-deformable. In particular, the rigid connection elements 210" are fixed to respective suspension anchorages 211" of the stator structure 207". The suspended mass 206" and the stator structure 207" of the reference microstructure 203 are capacitively coupled by a plurality of respective comb-fingered detection electrodes 212", which are arranged symmetrically to the detection electrodes 212 of the detection microstructure 202 with respect to the symmetry axis S3. More precisely, each detection electrode 212" of the stator structure 107" is fixed to a respective anchoring stator 214 and is coupled to a respective detection electrode 212" of the suspended mass 206". With reference to the arrangement of FIG. 6, the detection electrodes 212" arranged on the top side of the suspended mass 206" have their left-hand face coupled to the right-hand face of the respective detection electrode 212" of the stator structure 207"; instead, the detection electrodes 212" set on the bottom side of the suspended mass 206" have their right-hand face coupled to the left-hand face of the respective detection electrode 212" of the stator structure 207". Furthermore, the relative distances of the suspension anchorages 211" and of the stator anchorages 214" of the reference microstructure 203 are equal to the relative distances of the corresponding suspension anchorages 211 and stator anchorages 214 of the detection microstructure 202. The detection electrodes 212" of the stator microstructures 207' are connected to one another in sets in a conventional way and not illustrated in detail.

Figure 9:
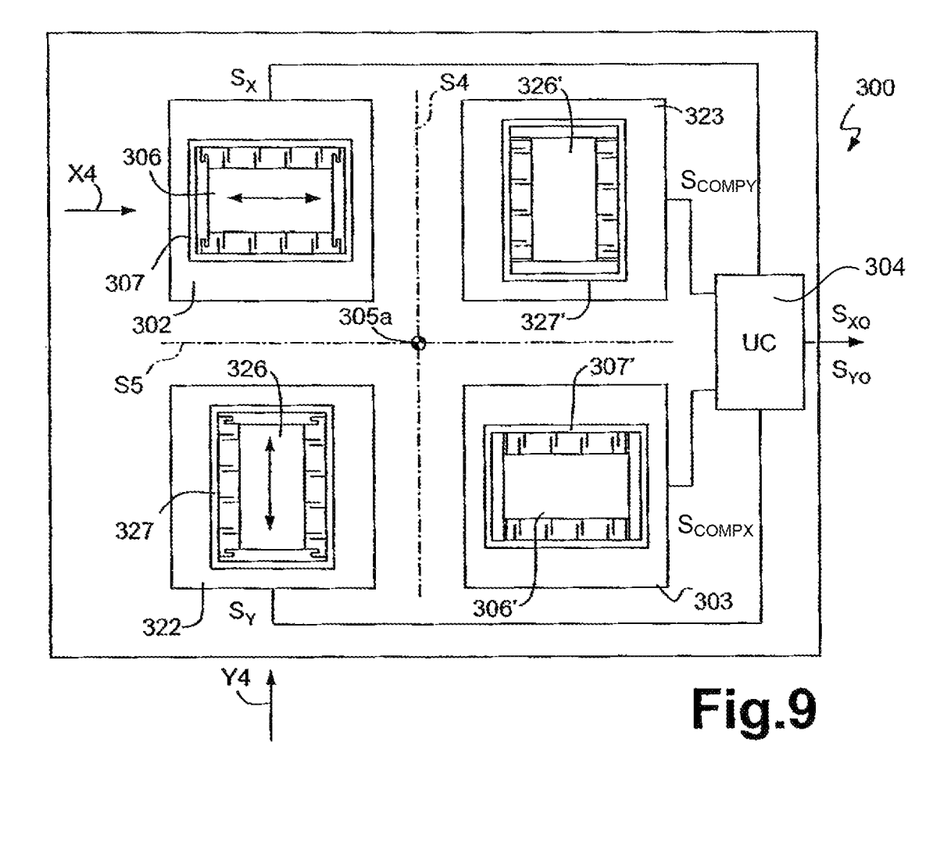
FIG. 9 is a simplified block diagram of a micro-electromechanical device according to a fourth embodiment of the present invention.

According to a fourth embodiment of the invention, illustrated schematically in FIG. 9, a MEMS accelerometer 300 has a first detection axis X4 and a second detection axis Y4 perpendicular to one another. The MEMS accelerometer 300 comprises a first detection microstructure 302 and a second detection microstructure 322, a first reference microstructure 303 and a second reference microstructure 323, and a control unit 304 integrated in a same semiconductor chip 305, of square or rectangular shape and having a center 305a of symmetry. The microstructures 302, 322, 303, 323 are all of the type described above with reference to FIGS. 7 and 8. In detail, the first detection microstructure 302 and the first reference microstructure 303 comprise respective suspended masses, designated by 306 and 306', having the same shape and dimensions; and respective stator structures, designated by 307 and 307', which also have the same shapes and dimensions. Furthermore, in the first detection microstructure 302, the suspended mass 306 is movable according to the first detection axis X4 with respect to the stator structure 307, whereas in the first reference microstructure 303 the suspended mass 306' is fixed. The second detection microstructure 322 and the second reference microstructure 323 comprise: respective suspended masses, designated by 326 and 326', having the same shape and dimensions; and respective stator structures, designated by 327 and 327', which also have the same shapes and dimensions. Furthermore, in the first detection microstructure 322, the suspended mass 326 is movable according to the second detection axis Y4 with respect to the stator structure 327, whereas in the second reference microstructure 323 the suspended mass 326' is fixed.

The first detection microstructure 302 detects the accelerations which act according to the first detection axis X4. The second detection microstructure 322 is rotated by 90° in the plane of FIG. 8 to detect the accelerations which act according to the second detection axis Y4. The first reference microstructure 303 is arranged symmetrically to the first detection microstructure 302 with respect to the center 305a of the chip 305. In practice, the configuration of the first reference microstructure 303 is obtained by overturning through 180° the first detection microstructure 302 (in the rest position) once about a first overturning axis S4 and once about a second overturning axis S5, which are parallel to the first detection axis X4 and to the second detection axis Y4, respectively, and pass through the center 305a of the chip 305. Similarly, the second reference microstructure 323 is arranged symmetrical to the second detection microstructure 322 with respect to the center 305a of the chip 305. The configuration of the second reference microstructure 323 is obtained by overturning through 180° the second detection microstructure 322 (in the resting position) once about the first axis S4 and once about the second overturning axis S5.

The first and second detection microstructures 302, 322 provide the control unit 304 with a first measurement signal $S_X$ and with a second measurement signal $S_Y$, which are correlated to the accelerations acting on the chip 305 according to the first detection axis X4 and to the second detection axis Y4, respectively. The first and the second reference microstructures 303, 323 provide the control unit 304 with a first compensation signal $S_{COMPX}$ and with a second compensation signal $S_{COMPY}$, which indicate the amount of the thermal expansion of the chip 305 in the direction of the first detection axis X4 and of the second detection axis Y4, respectively. Finally, the control unit 304 generates a first output acceleration signal $S_{XO}$, by subtracting the first compensation signal $S_{COMPX}$ from the first measurement signal $S_X$; and a second output acceleration signal $S_{YO}$, by subtracting the second compensation signal $S_{COMPY}$ from the second measurement signal $S_Y$.

In the fourth embodiment, in practice, the precision of the compensation is maximized, by arranging the detection microstructure and the compensation microstructure symmetrically with respect to the center of the chip.

Finally, it is clear that modifications and variations can be made to the device and to the method described herein, without thereby departing from the scope of the present invention, as defined in the annexed claims.

In particular, the invention can be exploited for compensating the effects of thermal expansion in various types of MEMS devices that use a mass that oscillates with respect to a fixed body, such as, for example, two-axes or three-axes linear accelerometers, rotational accelerometers, inclinometers, gyroscopes, pressure sensors, and electromechanical oscillators.

The control unit can be made separately, on a chip different from the one containing the microstructures.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A device, comprising:
   a substrate;
   a first detection structure including:
      a first plurality of electrodes, the first plurality of electrodes being fixed to the substrate;
      a first suspended mass elastically coupled to the substrate, the first suspended mass being movable relative to the substrate;
      a second plurality of electrodes extending from the first suspended mass, the second plurality of electrodes being movable relative to the substrate, the second plurality of electrodes configured to be capacitively coupled to the first plurality of electrodes;
   a second detection structure including:
      a third plurality of electrodes, the third plurality of electrodes being fixed to the substrate;
      a second suspended mass rigidly coupled to the substrate, the second suspended mass having a fixed position relative to the substrate, the first suspended mass and the second suspended mass being configured to undergo substantially equal strains as a result of thermal expansion of the substrate; and
      a fourth plurality of electrodes extending from the second suspended mass, the fourth plurality of electrodes having a fixed position relative to the substrate, the fourth plurality of electrodes configured to be capacitively coupled to the third plurality of electrodes.

2. The device of claim 1 wherein the first plurality of electrodes are symmetrical with the third plurality of electrodes with respect to an axis of the substrate.

3. The device of claim 1 wherein the second plurality of electrodes are symmetrical with the fourth plurality of electrodes with respect to an axis of the substrate.

4. The device of claim 1, further comprising:
   a first stator structure coupled to the substrate, the first suspended mass being elastically coupled to the first stator structure; and
   a second stator structure coupled to the substrate, the second suspended mass rigidly coupled to the second stator structure.

5. The device of claim 1 wherein the first suspended mass and the second suspended mass have substantially the same shape and dimensions.

6. The device of claim 1 wherein the first suspended mass is symmetrical with the second suspended mass with respect to a first axis.

7. The device of claim 6 wherein the first suspended mass is movable relative to the substrate along a second axis that is transverse to the first axis.

8. A device, comprising:
   a substrate;
   a first detection structure on the substrate, the first detection structure including:

a first plurality of electrodes rigidly coupled to the substrate, the first plurality of electrodes having a fixed position relative to the substrate;
a first suspended mass elastically coupled to the substrate, the first suspended mass being movable relative to the substrate along a first axis; and
a second plurality of electrodes coupled to the first suspended mass, the second plurality of electrodes being movable relative to the substrate along the first axis, the second plurality of electrodes configured to be capacitively coupled to the first plurality of electrodes; and
a second detection structure on the substrate, the second detection structure including:
a third plurality of electrodes rigidly coupled to the substrate, the third plurality of electrodes having a fixed position relative to the substrate;
a second suspended mass rigidly coupled to the substrate, the second suspended mass having a fixed position relative to the substrate, the first suspended mass and the second suspended mass being configured to undergo substantially equal strains as a result of thermal expansion of the substrate; and
a fourth plurality of electrodes coupled to the second suspended mass, the fourth plurality of electrodes having a fixed position relative to the substrate, the fourth plurality of electrodes configured to be capacitively coupled to the third plurality of electrodes, the first detection structure being symmetrical with the second detection structure with respect to a second axis that is transverse to the first axis.

9. The device of claim 8, further comprising:
a first stator structure coupled to the substrate, the first suspended mass being elastically coupled to the first stator structure; and
a second stator structure coupled to the substrate, the second suspended mass rigidly coupled to the second stator structure.

10. The device of claim 8 wherein the first plurality of electrodes are rigidly coupled to the first stator structure, and the third plurality of electrodes are rigidly coupled to the second stator structure.

11. The device of claim 8 wherein the first suspended mass and the second suspended mass have substantially the same shape and dimensions.

12. The device of claim 8 wherein the second plurality of electrodes includes a first set of electrodes and a second set of electrodes, the first set of electrodes are couples to a first side of the first suspended mass, the second set of electrodes are coupled to a second side, opposite to the first side, of the first suspended mass.

13. A method, comprising:
forming a first detection structure on a substrate, the forming of the first detection structure including:
forming a first plurality of electrodes that are rigidly coupled to the substrate, the first plurality of electrodes having a fixed position relative to the substrate;
forming a first suspended mass that is elastically coupled to the substrate, the first suspended mass being movable relative to the substrate along a first axis;
forming a second plurality of electrodes that are coupled to the first suspended mass, the second plurality of electrodes being movable relative to the substrate along the first axis, the second plurality of electrodes configured to be capacitively coupled to the first plurality of electrodes;
forming a second detection structure on the substrate, the forming of the second detection structure including:
forming a third plurality of electrodes that are rigidly coupled to the substrate, the third plurality of electrodes having a fixed position relative to the substrate;
forming a second suspended mass that is rigidly coupled to the substrate, the second suspended mass having a fixed position relative to the substrate, the first suspended mass and the second suspended mass being configured to undergo substantially equal strains as a result of thermal expansion of the substrate; and
forming a fourth plurality of electrodes that are coupled to the second suspended mass, the fourth plurality of electrodes having a fixed position relative to the substrate, the fourth plurality of electrodes configured to be capacitively coupled to the third plurality of electrodes, the first detection structure being symmetrical with the second detection structure with respect to a second axis that is transverse to the first axis.

14. The method of claim 13 wherein the first suspended mass and the second suspended mass have substantially the same shape and dimensions.

15. The method of claim 13 wherein the second plurality of electrodes includes a first set of electrodes and a second set of electrodes, the first set of electrodes are couples to a first side of the first suspended mass, the second set of electrodes are coupled to a second side, opposite to the first side, of the first suspended mass.

16. The method of claim 13 wherein the first plurality of electrodes are symmetrical with the third plurality of electrodes with respect to the second axis.

17. The method of claim 13 wherein the second plurality of electrodes are symmetrical with the fourth plurality of electrodes with respect to the second axis.

18. The device of claim 1 wherein
the first plurality of electrodes have first faces and opposite second faces,
the second plurality of electrodes have first faces and opposite second faces,
the first faces of the first plurality of electrodes face the second faces of the second plurality of electrodes,
the third plurality of electrodes have first faces and opposite second faces,
the fourth plurality of electrodes have first faces and opposite second faces,
the second faces of the third plurality of electrodes face the first faces of the fourth plurality of electrodes, and
the second faces of the first plurality of electrodes face the first faces of the third plurality of electrodes.

* * * * *